United States Patent [19]

Holler

[11] Patent Number: 4,906,865

[45] Date of Patent: Mar. 6, 1990

[54] SAMPLE AND HOLD CIRCUIT FOR TEMPORAL ASSOCIATIONS IN A NEURAL NETWORK

[75] Inventor: Mark A. Holler, Palo Alto, Calif.

[73] Assignee: Intel Corporation, Santa Clara, Calif.

[21] Appl. No.: 282,636

[22] Filed: Dec. 9, 1988

[51] Int. Cl.[4] ..................... G11C 27/02; H03K 19/20
[52] U.S. Cl. ...................................... 307/353; 307/201
[58] Field of Search ....................... 307/201, 353, 359;
328/151; 364/513, 602, 807

[56] References Cited

U.S. PATENT DOCUMENTS

| | | | |
|---|---|---|---|
| 3,103,648 | 9/1963 | Hartmanis | 307/201 |
| 3,950,733 | 4/1976 | Cooper et al. | 307/201 |
| 4,660,166 | 4/1987 | Hopfield | 364/807 |
| 4,760,437 | 7/1988 | Denker et al. | 357/30 |
| 4,773,024 | 9/1988 | Faggin et al. | 364/513 |
| 4,802,103 | 1/1989 | Faggin et al. | 364/513 |
| 4,807,168 | 2/1989 | Moopenn et al. | 307/201 |

OTHER PUBLICATIONS

"Self-Organization and Associative Memory", by Teuvo Kohonen, Springer-Verlag, N.Y., p. 1, 1987.
"Attractor Dynamics and Parallelism in a Connectionist Sequential Machine", by Michael I. Jordon.
"Recurrent Nets for the Storage of Cyclic Sequences", by Luzian Wolf.

Primary Examiner—John Zazworsky
Attorney, Agent, or Firm—Blakely, Sokoloff, Taylor & Zafman

[57] ABSTRACT

A sample and hold circuit for introducing delayed feedback into an associative memory is described. The circuit continuously samples an output sequence derived from a neural network; then, in response to a clock signal, it holds that output sequence until the next clock signal. The held sequence is coupled back to the input of the network so that the present output sequence becomes some function of the past output sequence. This delayed feedback enables the associative recall of a memorized sequence from the neural network.

11 Claims, 1 Drawing Sheet

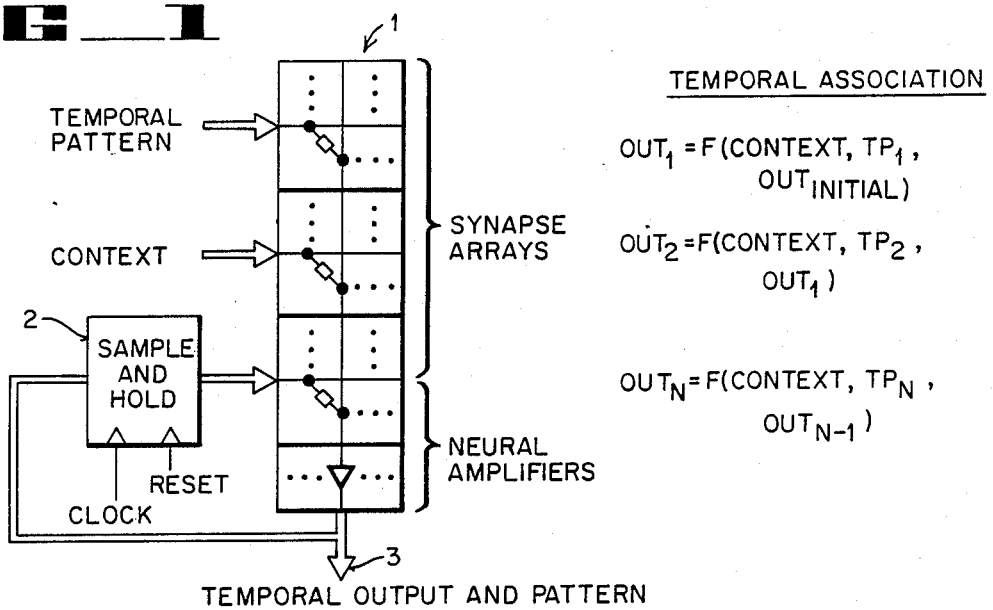
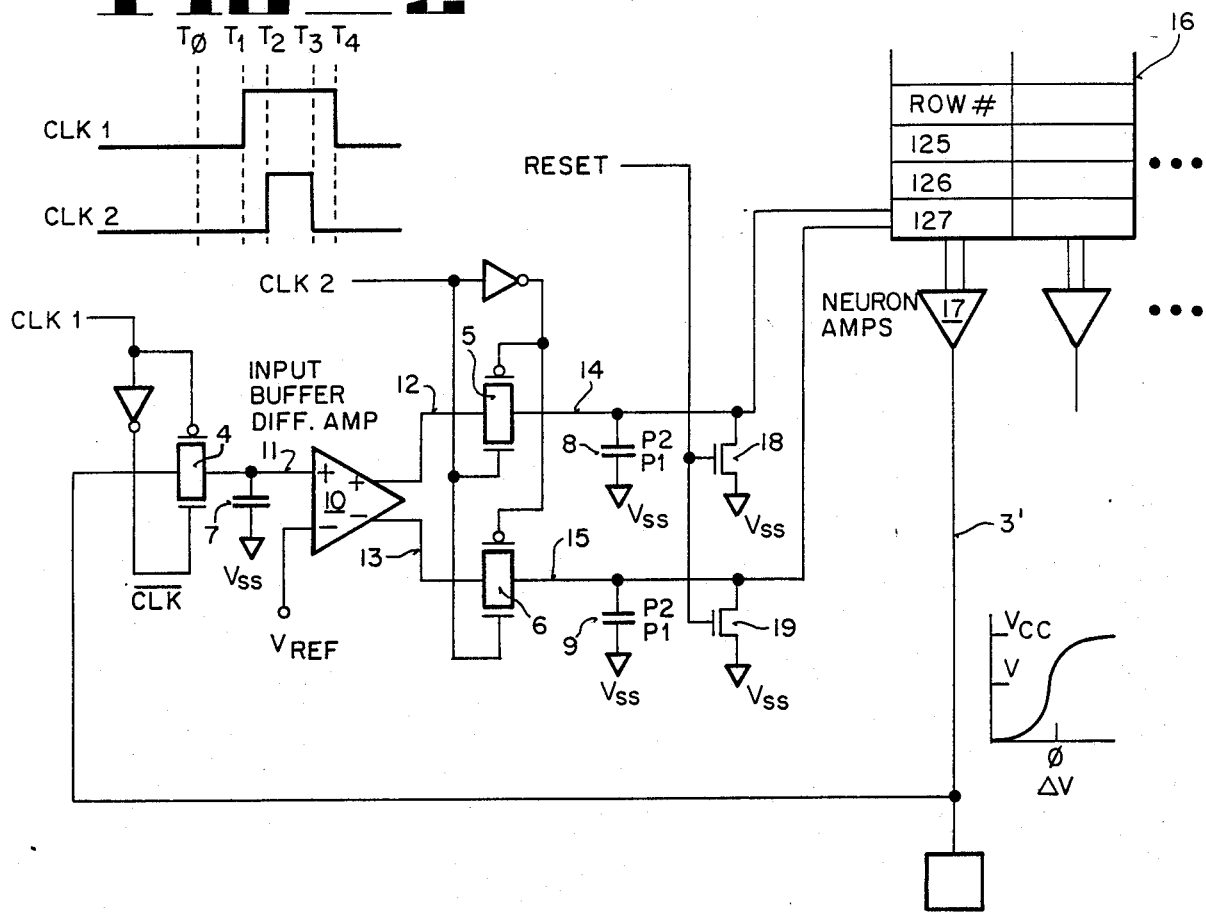

SAMPLE AND HOLD CIRCUIT FOR TEMPORAL ASSOCIATIONS IN A NEURAL NETWORK

FIELD OF THE INVENTION

The invention relates to the field of neural networks, particularly those capable of memorizing and reconstructing timed sequences.

BACKGROUND OF THE INVENTION

One of the key aspects of a biological memory is its ability to store and recall representations as structured sequences. Human beings and animals learn about their environment and temporally related occurrences by association within their memories. Mental items (ideas, perceptions, sensations or feelings) are connected in memory when they occur either simultaneously or in close succession, or alternatively, on the basis of similarity or contrast. Another important factor is the background or context in which perceptions occur; this, to a great extent, being responsible for the high capacity in selectivity of a human memory.

In the past several years, electronics researchers have attempted to duplicate the ability of the human brain to encode a sequence of items, and subsequently evoke that sequence by searching on the basis of similarity to an input pattern. Proposed models for mechanisms by which the temporal recall of memorized sequences can be achieved have centered around a state machine approach. Finite state machines for performing sequential operations are well-known in the field of digital computers but only recently have they been introduced into the field of analog neural networks and associative memories. For a general discussion of associative recall in a neural network, see "Self-Organization and Associative Memory", by Teuvo Kohonen, Springer-Verlag, N.Y., p. 1, 1987.

FIG. 1.10 of the Kohonen reference shows an associative memory for structured sequences. The memory, comprising a neural network having an array of synapses and neuron amplifiers, has external inputs for receiving a temporal pattern, a background or context, and a fedback pattern (which is a stored copy of a prior state of the outputs). Normally, each of these inputs would be coupled to the word line inputs of the synapse array. As explained by Kohonen, temporal recollection can be triggered if the network is excited by a particular temporal pattern in combination with a given context. An output sequence is produced, which in turn is delayed and fedback into the memory. The fedback pattern, in association with the other inputs, evokes the next pattern in the sequence, and so on.

Other prior art known to Applicant are the undated articles entitled "Attractor Dynamics and Parallelism in a Connectionist Sequential Machine" by Michael I. Jordan and "Recurrent Nets for the Storage of Cyclic Sequences" by Lvzian Wolf. Both articles generally discuss sequential behavior in a neural network but neither is considered pertinent to the present invention.

While there have been numerous proposed semiconductor cells for implementing synapses and neural amplifiers, Applicant is unaware of any proposed devices facilitating the temporal recall of structured sequences from an associative memory. Thus, what is needed is a device for providing a delayed feedback to a neural network.

SUMMARY OF THE INVENTION

A sample and hold circuit is described which is particularly useful in a neural network having an associative memory for memorizing and reconstructing time sequences. The sample and hold circuit provides a way of introducing delayed feedback of an output sequence into the neural network. The circuit includes a storage device which samples and holds an output pattern in response to a first clock pulse. The held pattern is then differentially amplified by an input buffer amplifier. In response to a second clock pulse, the differential signal is transferred into a second storage device. The second storage device is finally coupled to the synapse array of the neural network, thereby providing feedback to the network. The output sequence which is presented to the synapse array is held until a second set of clock pulses is delivered to the sample and hold device. Combined with temporal pattern and background or context inputs, the delayed feedback enables the associative recall of a memorized sequence from the neural network.

BRIEF DESCRIPTION OF THE DRAWINGS

FIG. 1 illustrates a neural network having an associative memory for production of sequences and the sample and hold circuit of the present invention.

FIG. 2 is an electrical schematic of the currently preferred embodiment of the present invention.

DETAILED DESCRIPTION OF THE INVENTION

The present invention provides a sample and hold device for introducing delayed feedback in a neural network so that recall of timed sequences can be accomplished. In the following description, numerous specific details are set forth in order to provide a thorough understanding of the present invention. It will be obvious, however, to one skilled in the art, that the present invention may be practiced without these specific details. In other instances, well-known structures such as neural amplifiers and synapse cells have not been set forth in order to avoid obscuring the present invention in unnecessary detail.

Referring to FIG. 1, a neural network 1 is shown having a temporal pattern input, a context input and a temporal output pattern 3. The output pattern 3 at a point in time is returned back to sample and hold device 2, which device comprises the object of the present invention. Ordinarily, the clock must change in synchronization with the input pattern.

In the preferred embodiment, a plurality of sample and hold devices, corresponding to individual rows in the synapse array of the neural network, would be integrated with the neural network as shown in FIG. 1. A typical cell includes dendrites (inputs), synapses (connections), a neuron body (summing amplifier) and axons (outputs). Each of the synapse cells includes a weighting factor or function defining the strength of the connection. A synapse cell suitable for use in conjunction with the present invention is disclosed in co-pending application, Ser. No. 225,035, filed July 27, 1988, entitled "Semiconductor Cell for Neural Network and the Like", and also in co-pending application entitled "Semiconductor Cell for Neural Network Employing a Four-Quadrant Multiplier", (Ser. No., 283,553, filed Dec. 9, 1988, both of which are assigned to the assignee of the present invention.

In the associative memory of FIG. 1, the output sequence at any given time is a function of the context, the input pattern and a previous sampled and held output pattern. This can be represented mathematically by the following equations:

$$out_1 = f(context, t_{p1}, out_{initial})$$
$$out_2 = f(context, t_{p2}, out_1)$$
$$\vdots$$
$$out_n = f(context, t_{pn}, out_{n-1})$$

Where $out_n$ represents the output pattern at any given time n and $t_{pn}$ represents the temporal input pattern at time n.

The sample and hold device 2 of FIG. 1 is shown in greater detail in the currently preferred embodiment of FIG. 2. With reference to FIG. 2, output pattern line 3', which is derived from output of neuron amplifier 17, is connected to the input of transmission gate 4. Transmission gate 4 has the gate of its p-channel device coupled to CLK1 while the gate of its n-channel device is coupled to $\overline{CLK1}$. Therefore, when CLK1 is in a low state transmission gate 4 will conduct freely and the voltage on line 3', representing the present output pattern, will be transferred to line 11. This is the condition shown at time $t_o$ of the timing diagram accompanying FIG. 2. The output pattern voltage delivered to line 11 via transmission gate 4 is stored in capacitor 7. Capacitor 7, coupled between line 11 and $V_{SS}$, may be implemented by a separate semiconductor device, or simply represent the capacitance associated with a typical interconnect line. Thus, the output pattern produced by neuron amplifier 17 is sampled by device 2 at time $t_o$, just prior to the leading edge of CLK1.

At time $t_1$, CLK1 is raised to a "high" state and transmission gate 4 becomes non-conductive. The sampled output pattern, held along line 11 by capacitor 7, is isolated from any changes which may occur in the output sequence of line 3'. Transmission gate 4 will not be conductive; hence, the present output sequence will not be sampled again until CLK1 returns to a low state.

Differential amplifier 10 is shown having a positive (+) input coupled to line 11 and a negative (-) input coupled to a reference potential $V_{REF}$. Besides providing gain, amplifier 10 also converts the single-ended signal of line 11 into a differential output, on lines 12 and 13. A differential signal is often required for input to synapse array cells, particularly those employing a four-quadrant multiplier approach. Amplifier 10 also acts as a buffer, preventing the charge stored on capacitor 7 from redistributing onto the lines 14, 15 when CLK2 goes high.

Lines 12 and 13 are shown in FIG. 2 coupled to transmission gates 5 and 6, respectively. Each of the transmission gates 5 and 6 are appropriately coupled to CLK2 so that both are off, i.e., nonconducting, when CLK2 is low. When CLK2 transitions to a high state, gates 5 and 6 will be conductive. This occurs at time $t_2$. The output pattern which has been stored along line 11 and differentially amplified by amplifier 10, will now be transmitted to lines 14 and 15. Lines 14 and 15 correspond to a word line pair connected to a single synapse row in the synapse array. For purposes of illustration, FIG. 2 shows lines 14 and 15 connected to row 127 of synapse array 16. Capacitors 8 and 9 are shown coupled between $V_{SS}$ and lines 14 and 15, respectively. These capacitors provide a means of storing and applying the transferred output pattern to the word line pair. Typically, they will be fabricated by the same process responsible for forming capacitor 7 or the word line capacitance itself may be used.

At time $t_3$, CLK1 remains high while CLK2 has now transitioned to a low state. Transmission gates 5 and 6 are non-conductive and the output sequence stored on lines 14 and 15 will be held there until the next set of clock pulses is applied. At time $t_4$, CLK1 has transitioned to a low state and the device has returned to a state identical to that of time $t_o$. In other words, at $t_o$ and $t_4$ a present output sequence (eg., $out_n$) is being sampled while a past output sequence (eg., $out_{n-1}$) is being held and applied to a row of synapse array 16. The amount of delay introduced into the feedback path is determined by the time interval separating sets of clock pulses (eg., the period of either CLK1 or CLK2).

It should be noted that the time difference separating the leading (or falling) edge of CLK1 from the leading (or falling) edge of CLK2 need only be large enough to insure that a direct conductive path does not exist between line 3' and lines 14 and 15. For instance, if CLK2 were high while CLK1 was low, gates 4, 5 and 6 would all be conductive; thereby providing direct feedback coupling to synapse array 16. Such direct coupling normally results in undesirable oscillations in neural network 1.

Also shown in FIG. 2 is a RESET input coupled to the control gates of field-effect devices 18 and 19. In the preferred embodiment, field-effect devices 18 and 19 are both n-channel devices having their drains coupled to lines 14 and 15, respectively, and their sources coupled to $V_{SS}$. In operation, RESET will normally be "low" or at a sufficiently low potential such that devices 18 and 19 are non-conductive. When the user wants to establish a known state of zeros along lines 14 and 15, RESET will be raised to a potential sufficient to make devices 18 and 19 conductive. Thus, lines 14 and 15 will be forced to $V_{SS}$, or ground potential.

This RESET capability can also be used to implement a two-layer neural network. A two-layer network would have a second synapse array coupled to the same set of neurons as that of the first synapse array. In operation, the second synapse array would be coupled to the feedback loop. Whenever the temporal pattern and context are "on", the feedback synapse array would be turned "off" via the RESET input. Whenever the feedback synapse array is "on", the temporal pattern and context portions of the network would be "off" or disabled. The neurons are used twice to process data from different sources using different synapse arrays. Multiplexing between two-layers in this manner has the salutary effect of saving valuable chip space.

Thus, a sample and hold device for introducing delayed feedback into a neural network has been disclosed. The device is responsive to a clock input permitting the recall of time sequences from an associative memory.

I claim:

1. An associative memory for memorizing and reconstructing time sequences of representations comprising:
   a neural network having a plurality of synapse inputs and an output providing an output pattern which varies in time, said neural network receiving a continuous sequence of data at said synapse inputs;

a nonintegrating sample and hold device having a data input coupled to said output of said network for sampling and holding said output pattern for a certain time period so as to produce a delayed output pattern at a feedback output coupled to at least one of said plurality of synapse inputs to provide feedback of said output pattern to said neural network; and a means for synchronizing said feedback output of said sample and hold device with the time domain of said continuous sequence of data to allow recognition of said continuous sequence by said neural network.

2. The associative memory of claim 1 wherein said plurality of synapse inputs includes a temporal pattern input and a context input such that when said temporal pattern and said context are provided in association with said delayed output pattern, a next output pattern is evoked at said output of said network thereby triggering temporal recall of said time sequence.

3. The associative memory of claim 2 further comprising a clocking means for providing clock pulses to said device such that the period of said clock pulses determines said time period.

4. An associative memory for memorizing and reconstructing time sequences of representations comprising:

a neural network having a plurality of synapse inputs for continuously receiving input data in the form of a temporal pattern, a context, and a delayed feedback of an output pattern, said neural network also having a plurality of neuron amplifiers and an output providing said output pattern which varies in time;

a nonintegrating sample and hold device having a clock input, and a data input coupled to said output of said neural network for sampling and holding said output pattern for a certain time period so as to produce a delayed output pattern at a feedback output coupled to at least one of said plurality of synapse inputs to provide feedback of said output pattern to said neural network; and a clocking means coupled to said clock input for producing clock pulses to said device, said clock pulses providing said delayed feedback of said output pattern such that when said temporal pattern, said context, and said delayed feedback are synchronously, presented to said network, temporal recollection of said time sequence is evoked.

5. The associative memory of claim 4 wherein the period between said clock pulses determines the delay in said delayed feedback.

6. The associative memory of claim 5 further comprising a reset means for placing said at least one of said plurality of synapse inputs at a predetermined potential.

7. In a neural network having a plurality of neural amplifiers and a plurality of synapse inputs for receiving a continuous sequence of data in the form of a temporal pattern and a context, a nonintegrating sample and hold circuit providing delayed feedback of an output pattern from said network comprising:

a first storage member having a clock input, a data input, and an output, said data input coupled to said output pattern of said network;

a differential amplifier having a first input coupled to said output of said first storage member and a second input coupled to a reference potential, said amplifier also having a differential output providing single-to-double-ended conversion of said output pattern;

a second storage member having a differential input coupled to said differential output of said amplifier, a clock input, and a differential word line coupled to at least one of said plurality of synapse inputs;

a clocking means for providing a first clock pulse to said clock input of said first storage member and a second clock pulse to said clock input of said second storage member;

said first storage member being responsive to said first pulse such that when said first pulse is absent said first storage member samples a present output pattern and when said first pulse is applied said first storage member holds said present output pattern, said second storage member being responsive to said second pulse such that when said second pulse is absent said second storage member holds a past one of said output pattern and when said second pulse is active said second storage member samples said present output pattern, amplified by said amplifier such that said word line output represents a delayed feedback of said output pattern, said first and second pulses being applied synchronous with said temporal pattern and said context inputs so as to facilitate temporal recall of a memorized sequence of representations.

8. The sample and hold circuit of claim 7, wherein said first storage member comprises a transmission gate coupled in parallel to a capacitor in said second storage member comprises a pair of transmission gates each of which is coupled in parallel to a capacitor.

9. The sample and hold circuit of claim 7, further comprising a reset means coupled to said second storage member for placing a predetermined potential on said word line output.

10. A method of providing delayed feedback of an output pattern in a neural network to facilitate a temporal recall of a memorized sequence of representations, said neural network receiving a continuous sequence of data in the form of a temporal pattern and a context said method comprising the steps of:

sampling said output pattern from said neural network;

holding said output pattern for a certain time period thereby producing a delayed output pattern;

inputting said delayed output pattern into said neural network synchronous with said temporal pattern and said context to evoke the next sequence in said memorized sequence.

11. A method of providing delayed feedback of an output pattern in a neural network to facilitate temporal recall of a memorized sequence of representations, said neural network receiving a continuous sequence of data in the form of a temporal pattern and a context input into a plurality of synapses, said method comprising the steps of:

sampling said output pattern from said neural network;

holding said output pattern in response to a first clock pulse;

differentially amplifying said output pattern being held;

storing said amplified output pattern in response to a second clock pulse for a certain time period, thereby producing a delayed output pattern;

inputting said delayed output pattern into at least one of said plurality of synapse inputs in said neural network synchronous with said temporal pattern and said context to evoke a next pattern in said memorized sequence.

* * * * *